United States Patent
Kaplan et al.

(10) Patent No.: US 11,061,066 B1
(45) Date of Patent: Jul. 13, 2021

(54) PREDICTIVE MAINTENANCE SYSTEM FOR AVIATION POWER SUPPLIES

(71) Applicant: Rockwell Collins, Inc., Cedar Rapids, IA (US)

(72) Inventors: Daniel J. Kaplan, Melbourne Beach, FL (US); Christopher A. Hohensee, Palm Bay, FL (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 394 days.

(21) Appl. No.: 16/050,572

(22) Filed: Jul. 31, 2018

(51) Int. Cl.
| G01R 31/28 | (2006.01) |
| H02M 1/32  | (2007.01) |
| B64D 31/00 | (2006.01) |
| G01R 31/00 | (2006.01) |
| H02M 1/00  | (2006.01) |

(52) U.S. Cl.
CPC .......... *G01R 31/282* (2013.01); *B64D 31/00* (2013.01); *G01R 31/008* (2013.01); *H02M 1/32* (2013.01); *B64D 2221/00* (2013.01); *H02M 2001/0009* (2013.01)

(58) Field of Classification Search
CPC .... G01R 31/282; G01R 31/008; B64D 31/00; B64D 2221/00; H02M 1/32; H02M 2001/0009
USPC .................................................. 324/500, 537
See application file for complete search history.

(56) References Cited

U.S. PATENT DOCUMENTS

| 8,175,818 B2* | 5/2012 | Foucher | G01D 9/005 702/34 |
| 9,919,812 B2* | 3/2018 | Shi | G08B 21/185 |
| 2010/0121587 A1* | 5/2010 | Vian | H01M 10/48 702/63 |
| 2012/0179326 A1* | 7/2012 | Ghelam | G06F 11/3013 701/31.9 |
| 2016/0086396 A1* | 3/2016 | Nutaro | G07C 5/0808 701/29.4 |
| 2018/0275184 A1* | 9/2018 | Essawy | G01P 13/025 |
| 2019/0113558 A1* | 4/2019 | Kumar | G01R 31/008 |

* cited by examiner

*Primary Examiner* — Christopher E Mahoney
(74) *Attorney, Agent, or Firm* — Suiter Swantz pc llo

(57) ABSTRACT

A predictive maintenance system for an aircraft-based power converter subsystem (PCS) continuously measures primary system parameters such as input and output currents and voltages, ambient and PCS component temperatures, and hold-up capacitance voltage. The predictive maintenance system updates the likely failure rate of the PCS based on the primary parameters and secondary parameters (e.g., power consumption, power efficiency, thermal resistance, hold-up storage capacitance) derived therefrom. Sensed primary parameters and derived secondary parameters, as well as the updated failure rate, are stored to memory in order to monitor their time derivatives and regression over the PCS lifespan. Should the updated failure rate ever reach or exceed an acceptable failure rate threshold, the predictive maintenance system alerts the aircraft control system, end user, or provider to service the PCS in advance of an unanticipated field failure.

15 Claims, 2 Drawing Sheets

PREDICTIVE MAINTENANCE SYSTEM FOR AVIATION POWER SUPPLIES

BACKGROUND

Aircraft-based power supplies for avionics applications—for example, a power converter subsystem (PCS) for delivering regulated load voltages to downstream avionics components—have demanding reliability requirements but also incorporate components that degrade over time. This degradation results in out-of-specification performance as, for example, the PCS experiences reduced hold-up time due to the degradation of bulk capacitors, reduced efficiency due to system losses, and higher operating temperatures due to failing thermal interface materials. With respect to hold-up capacitors, incorporated into the PCS to ensure that downstream components can play through temporary disturbances in (or losses of) input power, often the first sign of out-of-spec performance to the end user is a system failure during aircraft operations. For example, conventional bulk capacitors may experience degradations in storage capacity over their lifetime due to tolerance and temperature effects. Downstream microprocessors may use a hard-wired voltage setting to track the time remaining before the capacitors are depleted, but this warning signal must be set at a highly conservative threshold as it cannot deal with variations in load consumption or changes in storage capacity. Similarly, the hold-up capacitors, and the PCS generally. may be overdesigned to compensate for component degradation, adding volume, weight, and cost.

SUMMARY

In one aspect, embodiments of the inventive concepts disclosed herein are directed to a predictive maintenance system for an aircraft-based power converter subsystem (PCS) or like aircraft power supply; for example, the PCS receives an input current from an aircraft-based power supply and provides regulated load voltages to downstream components, with a hold-up capacitance subsystem for supplying temporary power during outage periods. The system includes monitor circuits for measuring primary parameters within the PCS, e.g., input and output (load) currents and voltages, ambient and component temperatures, and the capacitance voltage of the hold-up bulk capacitors. Based on these primary parameters, the predictive maintenance subsystem may determine secondary parameters such as input and output power, power efficiency, thermal resistances and storage capacitance (as well as time derivatives of the primary and secondary parameters). Based on the primary and secondary parameters, the likely failure rate of the PCS and its components may be updated; if the likely failure rate exceeds an acceptable failure rate threshold, the predictive maintenance system sends a warning message in advance of an unanticipated field failure. Recently sensed and determined parameters, as well as the updated failure rate, are stored to memory for long-term monitoring.

In a further aspect, embodiments of the inventive concepts disclosed herein are directed to a line replaceable unit (LRU) installable aboard an aircraft and connectable to an aircraft-based power supply. The LRU includes a power converter subsystem (PCS) for receiving an input current from the aircraft power supply and providing regulated load voltages to downstream components (e.g., processors, amplifiers, antennas, communication circuits) and a hold-up capacitance subsystem for supplying temporary power to the downstream loads during power outages or disturbances. The LRU includes a predictive maintenance subsystem whereby monitor circuits measure primary parameters within the PCS and hold-up capacitance subsystem, e.g., input and output (load) currents and voltages, ambient and component temperatures, and the capacitance voltage of the hold-up bulk capacitors. Based on these primary parameters, the predictive maintenance subsystem may determine secondary parameters such as input and output power, power efficiency, thermal resistances and storage capacitance (as well as time derivatives of the primary and secondary parameters). Based on the primary and secondary parameters, the likely failure rate of the PCS and its components may be updated; if the likely failure rate exceeds an acceptable failure rate threshold, the predictive maintenance system sends a warning message in advance of an unanticipated field failure. Recently sensed and determined parameters, as well as the updated failure rate, are stored to memory for long-term monitoring.

In a still further aspect, embodiments of the inventive concepts disclosed herein are directed to a method for predictive maintenance in a power converter subsystem (PCS) or like aviation power supply system. The control processors of the predictive maintenance subsystem load from onboard memory the most recently stored likely failure rate of the PCS (or its hold-up capacitance subsystem). If the failure rate exceeds an acceptable failure rate threshold, the predictive maintenance subsystem sends a warning message that maintenance is required in advance of an unanticipated field failure. Monitor circuits of the predictive maintenance subsystem measure primary parameters of the PCS, such as input and output (load) currents and voltages, ambient and component temperatures, and the capacitance voltage of the hold-up bulk capacitors. Based on the sensed primary parameters, the predictive maintenance subsystem determines secondary parameters such as input and output power, power efficiency, thermal resistances and storage capacitance (as well as time derivatives of the primary and secondary parameters). Based on these primary and secondary parameters, the likely failure rate of the PCS and its components may be updated (e.g., to reflect the most recent operating cycle). Recently sensed and determined parameters, as well as the updated failure rate, are stored to memory for long-term monitoring.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF EXEMPLARY EMBODIMENTS

Figure 1:
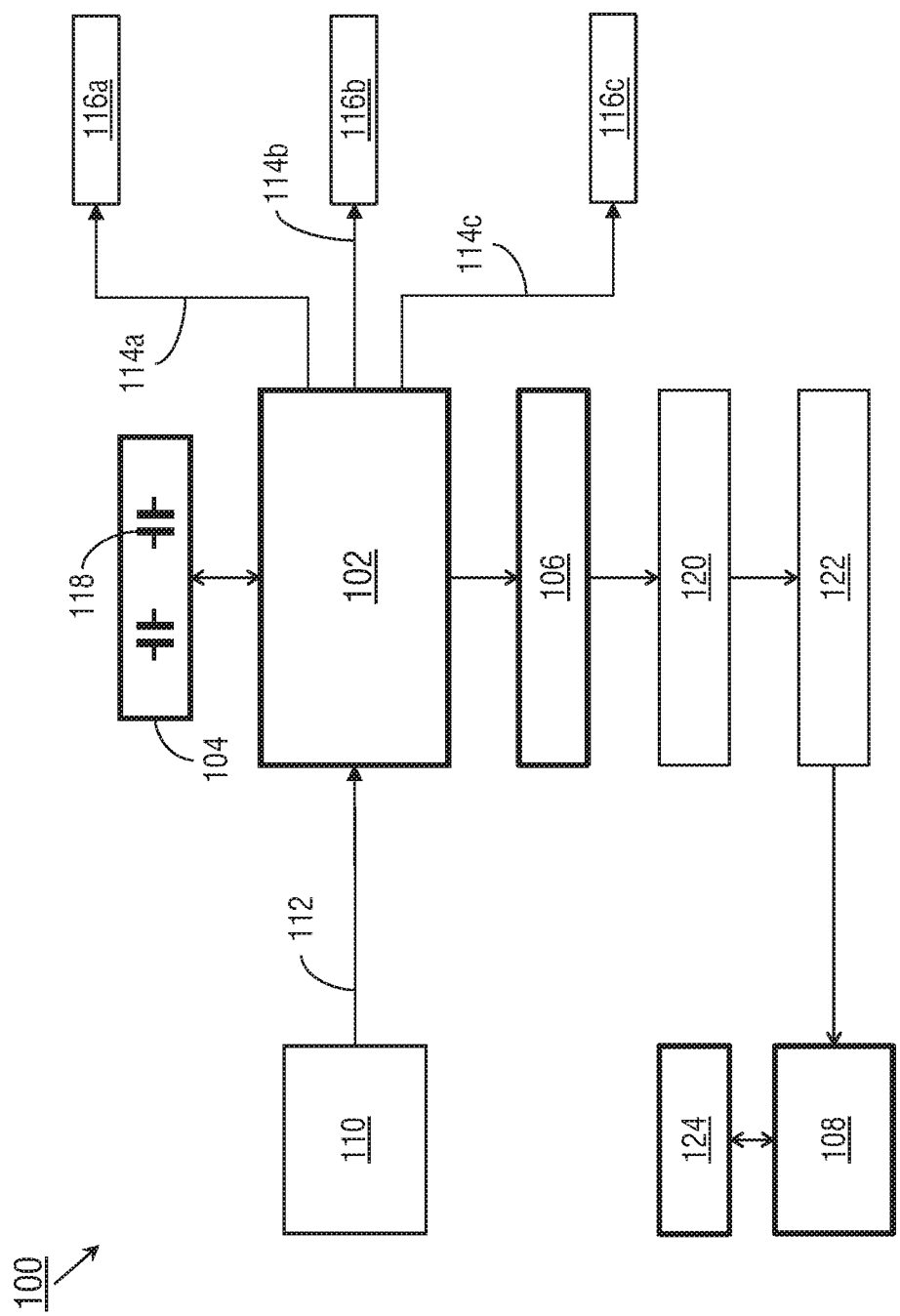
FIG. 1 illustrates an exemplary embodiment of a system according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a predictive digital telemetry maintenance system for monitoring critical PCS parameters over time. By analyzing these system parameters, the predictive maintenance system may assess the likely failure rate of the PCS over time, signaling when maintenance is required in advance of a field system failure. As a result, overall downtime may be reduced, mean time between failures (MTBF) may be increased, and PCS components may be right-sized to eliminate redundancies or overdesigns (e.g., extra bulk capacitors), reducing system volume, weight, and cost.

Referring to FIG. 1, an exemplary embodiment of a predictive maintenance system 100 according to the inventive concepts disclosed herein may include a power converter subsystem 102 (PCS), a hold-up capacitance subsystem 104, monitor circuits 106, and control processor/s 108. The predictive maintenance system 100 may be embodied in a line replaceable unit (LRU) installable aboard an aircraft and couplable to an aircraft-based power supply (110); e.g., the control processor 108 may be a control processor of the LRU generally, executing additional tasks and operations above and beyond those directly supportive of the predictive maintenance system 100. The PCS 102 may generate, based on input (112) from the aircraft-based power supply 110, regulated voltages (114a-c) for use by downstream loads 116a-c. For example, downstream loads 116a-c may include, but are not limited to, other avionics components such as microprocessors, power amplifiers, antenna elements, and communication circuits. The hold-up capacitance subsystem 104 may include several bulk capacitors (118) for temporary energy storage; the bulk capacitors 118 may serve as a temporary supply to the downstream loads 116 during temporary power disturbances or outages.

The monitor circuits 106 may include voltage, current, and temperature sensors positioned throughout the PCS 102 to continuously monitor primary parameters such as the input current (112) and corresponding input voltage; the output (load) voltage (114a-c) and corresponding load current to each downstream load 116a-c; component temperatures within the PCS or within the hold-up capacitance subsystem 104; the ambient temperature of the PCS; and the hold-up voltage of the bulk capacitors 118.

Based on the sensed primary parameters, the predictive maintenance system 100 may determine secondary parameters in order to monitor over time the likely failure rate of the PCS 102. The predictive maintenance system 100 may incorporate analog-digital converters 120 (ADC) and communications circuits 122 to digitize the sensed primary parameters and transmit the digitized parameters to the control processor 108. Should the likely failure rate exceed a predetermined threshold (e.g., stored in onboard memory 124), the control processor 108 may send an alert message (e.g., to an aircraft based network or, via the network, to an avionics control system). The alert message may indicate to the end user (e.g., an aircraft owner, pilot, or maintenance provider), that maintenance is required on the PCS 102, prior to a system failure in the field.

The predictive maintenance system 100 may monitor the remaining lifespan of the PCS 102 (including the hold-up capacitance subsystem 104 and its individual bulk capacitors 118) on a closed-loop feedback basis. For example, the likely failure rate of the PCS 102 at any given time may be expressed as a regression function developed via machine learning to fit the sensed primary parameters as well as their time derivatives. The predictive maintenance system 100 may update the failure rate regression function as additional lifespan data accumulates. The secondary parameters determined by the control processor 108 may be based on likely contributing factors to failure of the PCS 102 or hold-up capacitance subsystem 104, e.g., decline in hold-up capability of the bulk capacitors 118; reductions in system efficiency; increases in operating temperatures and decreases in system cooling capability; and extended operating times.

Figure 2:
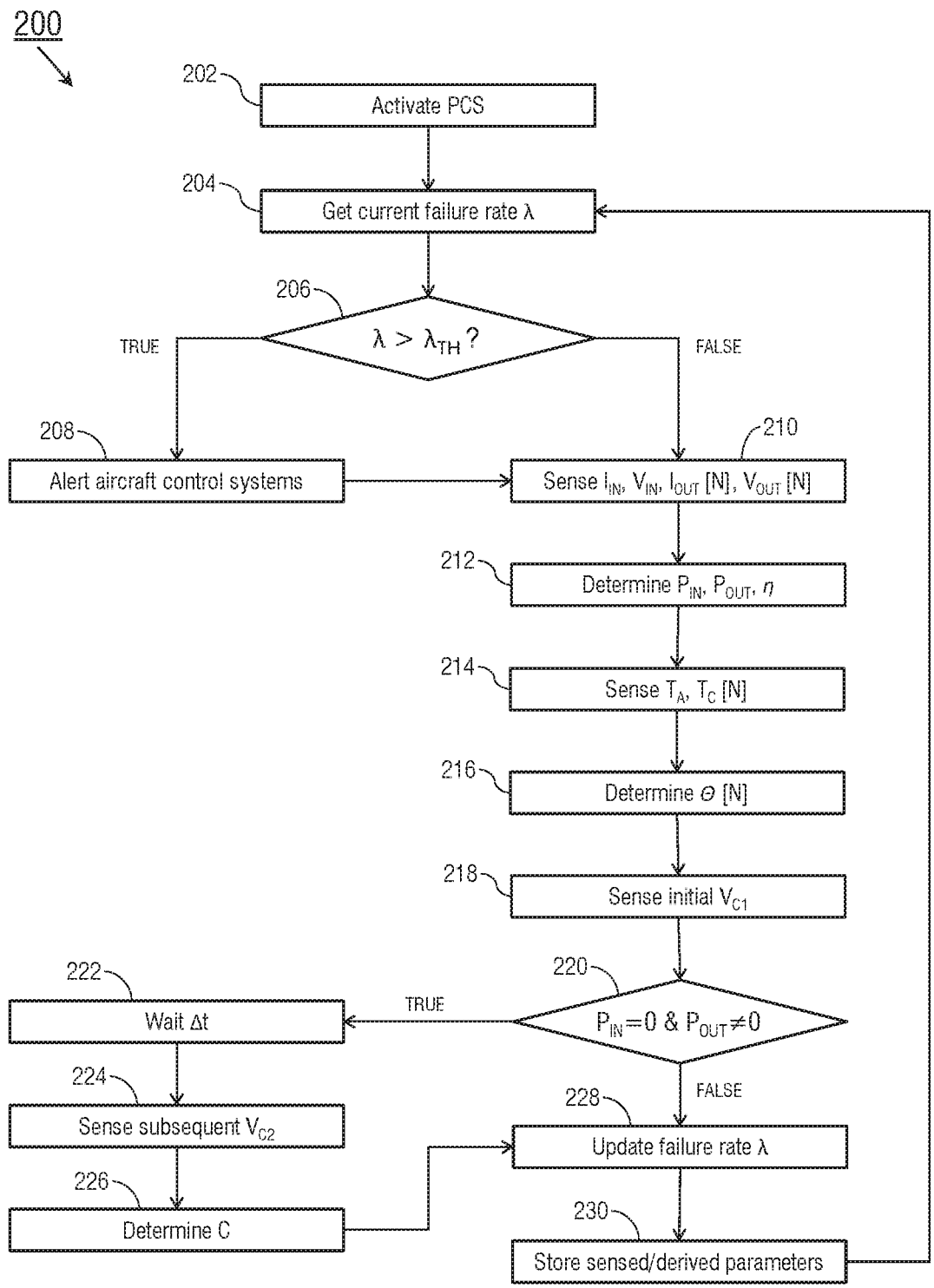
FIG. 2 illustrates an exemplary embodiment of a method according to the inventive concepts disclosed herein.

Referring to FIG. 2, the process 200 may be implemented via the predictive maintenance system 100 of FIG. 1. For example, upon initialization or activation (202) of the PCS (102, FIG. 1), the control processor (108, FIG. 1) may retrieve the most recently updated (e.g., previously calculated) failure rate $\lambda$ (204) from memory (124, FIG. 1). The most recent failure rate $\lambda$ may be compared to a predetermined acceptable failure rate threshold $\lambda_{TH}$ (206). If the failure rate λ exceeds the acceptable failure rate threshold $\lambda_{TH}$, the control processor 108 may alert the aircraft supersystems (208) that maintenance of the PCS is required (e.g., the control processor may alert the aircraft pilot or crew, ground-based control personnel, or a maintenance provider). Otherwise, the monitor circuits (106, FIG. 1) may sense the input current and voltage $I_{IN}$, $V_{IN}$ and, for each downstream load 1 through N (116a-c, FIG. 1) the output (load) current and voltage $I_{OUT}$ [N], $V_{OUT}$ [N] (210), from which the control processor 108 may determine (212) the input power, e.g.

$$P_{IN} = I_{IN} V_{IN}$$

and output power, e.g.

$$P_{OUT} = \sum_{k=1}^{N} I_{OUT}[K] V_{OUT}[K]$$

and determine the current system power efficiency, e.g.

$$\eta = \frac{P_{OUT}}{P_{IN}}$$

based on the determined output power and input power.

The monitor circuits 106 may sense (214) the system ambient temperature $T_A$ and component temperatures $T_C$[N] within the PCS 102 or hold-up capacitance subsystem (104, FIG. 1). Based on the sensed temperature values as well as the input and output power, the control processor 108 may assess the cooling capacity of the PCS 102 and/or hold-up capacitance subsystem 104 by determining thermal resistances, e.g.

$$\theta[N] = \frac{T_C[N] - T_A}{P_{IN} - P_{OUT}}$$

for each component. Finally, the hold-up capacitance C may be estimated by measuring (218) an initial capacitance voltage $V_{C1}$ of the bulk capacitors (118, FIG. 1) and then (e.g., during a loss of input power event (220) and after a time interval Δt (222)) measuring (224) the capacitance voltage once more ($V_{C2}$) and determining (226), based on the change in voltage, the hold-up capacitance of the bulk capacitors 118, e.g.

$$C = \frac{(\Delta t)(P_{OUT})}{(V_{C1})(V_{C1} - V_{C2})}$$

Based on the most recently measured primary parameter values and the most recently determined secondary parameter values, the control processor 108 may update (228) the failure rate λ via the regression function. The recently updated failure rate λ, along with all measured primary parameters and determined secondary parameters and time derivatives, may be stored (230) to memory 124. The process 200 may continuously repeat throughout the lifetime of the PCS 102.

As will be appreciated from the above, systems and methods according to embodiments of the inventive concepts disclosed herein may reduce overall downtime and increase MTBF (as well as PCS reliability generally) by alerting end users that maintenance of the PCS (or its hold-up capacitors) is required in advance of an unanticipated field failure. The ability to track likely power failure time (e.g., by monitoring bulk capacitor voltage or input voltage) may eliminate the need for a hard-wired power-failure signal, and the ability to track remaining energy levels (e.g., by monitoring capacitor voltage and load currents/voltages) may eliminate the need for the hard-wired discrete power-warning signal mentioned above. Further, the PCS itself may be right-sized as there is no longer a need to overdesign against such field failures; for example, the hold-up capacitance subsystem may be reduced from three bulk capacitors to two, significantly reducing weight and cost factors associated with the PCS.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

We claim:

1. A predictive maintenance system for an aircraft power supply, comprising:
    a plurality of monitor circuits couplable to a power converter subsystem (PCS), the PCS configured to generate at least one of a load voltage and a load current based on at least one of an input voltage and an input current received from an aircraft-based power supply, the load voltage and the load current associated with a downstream component, the PCS further comprising a plurality of bulk capacitors configured to maintain a hold-up voltage, the plurality of monitor circuits configured to measure one or more primary parameters associated with the PCS;
    a memory configured to store at least one failure rate associated with the PCS;
    and
    at least one processor coupled to the memory and to the plurality of monitor circuits, the processor configured to:
        a) load the most recently stored failure rate;
        b) compare the failure rate to a predetermined threshold;
        c) if the failure rate exceeds the predetermined threshold, alert at least one aircraft-based network coupled to the PCS;
        d) determine, based on the one or more primary parameters, one or more secondary parameters associated with the PCS;
        e) update the failure rate based on the one or more secondary parameters;

and
f) store the updated failure rate, the primary parameters, and the secondary parameters to the memory.

2. The predictive maintenance system of claim 1, wherein the one or more primary parameters include at least one of:
1) the input voltage;
2) the input current;
3) the load voltage;
4) the load current;
5) a component temperature associated with one or more of the PCS and the plurality of bulk capacitors;
6) an ambient temperature associated with the PCS; and
7) a capacitance voltage associated with the plurality of bulk capacitors.

3. The predictive maintenance system of claim 2, wherein the one or more secondary parameters include at least one of:
1) an input power;
2) an output power;
3) a power efficiency;
4) a thermal resistance; and
5) a storage capacitance.

4. The predictive maintenance system of claim 1, wherein the plurality of monitor circuits are coupled to the at least one processor via one or more of:
an analog-digital converter (ADC) configured to digitize the one or more primary parameters; and
a digital communication circuit configured to transmit the digitized primary parameters to the processor.

5. The predictive maintenance system of claim 1, wherein the processor is configured to update the failure rate based on one or more of:
a first time derivative of the one or more primary parameters; and
a second time derivative of the one or more secondary parameters.

6. The predictive maintenance system of claim 1, wherein:
the system is embodied within a line replaceable unit (LRU) removably installed aboard an aircraft.

7. A line replaceable unit (LRU) removably installable aboard an aircraft, comprising:
a power converter subsystem (PCS) couplable to an aircraft-based power supply, the PCS configured to:
1) receive at least one of an input current and an input voltage from the power supply; and
2) provide one or more of a load current and a load voltage to at least one downstream component coupled to the PCS;
at least one bulk capacitor coupled to the PCS and configured to store a hold-up voltage;
a plurality of monitor circuits coupled to the PCS and configured to measure one or more primary parameters, the primary parameters including at least one of the input current, the input voltage, the load current, the load voltage, an ambient temperature, a component temperature associated with one or more of the PCS and the at least one bulk capacitor, and the hold-up voltage;
a memory configured to store at least one failure rate associated with the PCS; and at least one processor coupled to the monitor circuits and the memory, the processor configured to:
a) load the most recently stored failure rate;
b) compare the failure rate to a predetermined threshold;
c) if the failure rate exceeds the predetermined threshold, alert at least one aircraft-based network coupled to the PCS;
d) determine, based on the most recently measured primary parameters, one or more secondary parameters associated with the PCS;
e) update the failure rate based on the one or more secondary parameters; and
f) store the updated failure rate, the primary parameters, and the secondary parameters to the memory.

8. The LRU of claim 7, wherein the one or more secondary parameters include at least one of:
1) an input power;
2) an output power;
3) a power efficiency;
4) a thermal resistance; and
5) a storage capacitance.

9. The LRU of claim 7, wherein the plurality of monitor circuits are coupled to the at least one processor via one or more of:
an analog-digital converter (ADC) configured to digitize the one or more primary parameters; and
a digital communication circuit configured to transmit the digitized primary parameters to the processor.

10. The LRU of claim 7, wherein the processor is configured to update the failure rate based on one or more of:
a first time derivative of the one or more primary parameters; and
a second time derivative of the one or more secondary parameters.

11. A method for predictive maintenance in an aviation power supply system, the method comprising:
loading, via a processor of a power converter subsystem (PCS) installed aboard an aircraft, a most recently stored failure rate of the PCS;
comparing, via the processor, the failure rate to a failure rate threshold;
if the failure rate exceeds the failure rate threshold, sending an alert message to at least one network of the aircraft;
sensing, via monitor circuits of the PCS, one or more primary parameters associated with at least one of 1) the PCS, 2) an aircraft power supply coupled to the PCS and configured to provide an input thereto, 3) a downstream component coupled to the PCS and configured to receive a load therefrom, and 4) a bulk capacitor coupled to the PCS and configured to store a hold-up voltage;
determining, via the processor, one or more secondary parameters based on the one or more sensed primary parameters;
updating, via the processor, the failure rate based on the one or more determined secondary parameters; and
storing at least one of the updated failure rate, the one or more determined secondary parameters, and the one or more sensed primary parameters to the memory.

12. The method of claim 11, wherein sensing, via monitor circuits of the PCS, one or more primary parameters associated with at least one of 1) the PCS, 2) an aircraft power supply coupled to the PCS and configured to provide an input thereto, 3) a downstream component coupled to the PCS and configured to receive a load therefrom, and 4) a bulk capacitor coupled to the PCS and configured to store a hold-up voltage includes:
    sensing, via monitor circuits of the PCS, one or more of 1) an input voltage; 2) an input current; 3) a load voltage; 4) a load current; 5) a component temperature; 6) an ambient temperature; and 7) the hold-up voltage.

13. The method of claim 11, wherein determining, via the processor, one or more secondary parameters based on the one or more sensed primary parameters includes:
    determining, via the processor, one or more of 1) an input power; 2) a load power; 3) a power efficiency; 4) a thermal resistance; and 5) a storage capacitance.

14. The method of claim 11, wherein determining, via the processor, one or more secondary parameters based on the one or more sensed primary parameters includes:
    determining, via the processor, at least one time derivative of the one or more sensed primary parameters.

15. The method of claim 11, wherein determining, via the processor, one or more secondary parameters based on the one or more sensed primary parameters includes:
    determining, via the processor, at least one time derivative of the one or more secondary parameters.

\* \* \* \* \*